United States Patent
Yun et al.

(10) Patent No.: US 10,811,254 B2
(45) Date of Patent: Oct. 20, 2020

(54) METHOD FOR FABRICATING METAL CHALCOGENIDE THIN FILMS

(71) Applicant: Electronics and Telecommunications Research Institute, Daejeon (KR)

(72) Inventors: Sun Jin Yun, Daejeon (KR); JungWook Lim, Daejeon (KR); Kwang Hoon Jung, Changwon-si (KR); Hyun Jun Chai, Cheonan-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/047,871

(22) Filed: Jul. 27, 2018

(65) Prior Publication Data

US 2019/0067005 A1    Feb. 28, 2019

(30) Foreign Application Priority Data

Aug. 29, 2017    (KR) .................. 10-2017-0109721
Feb. 19, 2018    (KR) .................. 10-2018-0019569

(51) Int. Cl.
  *H01L 21/02*    (2006.01)
  *C23C 16/56*    (2006.01)
  (Continued)

(52) U.S. Cl.
  CPC ........ *H01L 21/02568* (2013.01); *C23C 14/06* (2013.01); *C23C 14/18* (2013.01);
  (Continued)

(58) Field of Classification Search
  CPC ......... H01L 21/02568; H01L 21/02614; H01L 21/0262; H01L 21/02664; H01L 21/56
  See application file for complete search history.

(56) References Cited

U.S. PATENT DOCUMENTS 8,039,926 B2    10/2011  Song et al.
2011/0294254 A1*  12/2011  Jackrel ............... H01L 31/0322
                                         438/95
(Continued)

FOREIGN PATENT DOCUMENTS

KR    10-2016-0017602 A    2/2016
KR       10-1623791 B1      5/2016
(Continued)

OTHER PUBLICATIONS

Keng-Ku Liu et al., "Growth of Large-Area and Highly Crystalline MoS$_2$ Thin Layers on Insulating Substrates", Nano Letters, 12, pp. 1538-1544, Feb. 27, 2012.
(Continued)

*Primary Examiner* — Dale E Page
*Assistant Examiner* — Quovaunda Jefferson
(74) *Attorney, Agent, or Firm* — Rabin & Berdo, P.C.

(57) ABSTRACT

Provided is a method for fabricating high-uniformity and high-quality metal chalcogenide thin films. The method for fabricating metal chalcogenide thin films may include forming a metal precursor thin film including a metal thin film and a chalcogen thin film disposed on the upper surface or lower surface of the metal thin film; and performing a chalcogenization process for providing a chalcogen source on the metal precursor thin film to form a first metal chalcogenide thin film.

21 Claims, 9 Drawing Sheets

(51) Int. Cl.
*H01L 21/56* (2006.01)
*C23C 16/30* (2006.01)
*C23C 16/455* (2006.01)
*H01L 29/24* (2006.01)
*C23C 14/18* (2006.01)
*H01L 29/66* (2006.01)
*C23C 14/58* (2006.01)
*C23C 14/06* (2006.01)
*H01L 29/786* (2006.01)
*H01L 29/778* (2006.01)

(52) U.S. Cl.
CPC ........ *C23C 14/5866* (2013.01); *C23C 16/305* (2013.01); *C23C 16/45553* (2013.01); *C23C 16/56* (2013.01); *H01L 21/0262* (2013.01); *H01L 21/02614* (2013.01); *H01L 21/02664* (2013.01); *H01L 21/56* (2013.01); *H01L 29/24* (2013.01); *H01L 29/66742* (2013.01); *H01L 29/78681* (2013.01); *H01L 29/778* (2013.01)

(56) References Cited

U.S. PATENT DOCUMENTS

2015/0111392 A1* 4/2015 Ishii ................. H01L 21/02551
　　　　　　　　　　　　　　　　　　　　　　438/758
2015/0170907 A1　 6/2015 Haukka et al.
2016/0035568 A1* 2/2016 Chung ............. H01L 21/02568
　　　　　　　　　　　　　　　　　　　　　　438/478

FOREIGN PATENT DOCUMENTS

KR　　10-2016-0098322 A　　8/2016
KR　　　10-1689471 B1　　12/2016

OTHER PUBLICATIONS

Kibum Kang et al., "High-mobility three-atom-thick semiconducting films with wafer-scale homogeneity", Nature, vol. 520, pp. 656-660, Apr. 30, 2015.

* cited by examiner

METHOD FOR FABRICATING METAL CHALCOGENIDE THIN FILMS

CROSS-REFERENCE TO RELATED APPLICATIONS

This U.S. non-provisional patent application claims the benefit of priority under 35 U.S.C. § 119 to Korean Patent Application No. 10-2017-0109721, filed on Aug. 29, 2017, and Korean Patent Application No. 10-2018-0019569, filed on Feb. 19, 2018, in the Korean Intellectual Property Office, the entire contents of which are incorporated by reference herein in its entirety.

BACKGROUND

The present disclosure herein relates to a method for fabricating metal chalcogenide thin films, and more particularly, to a method for fabricating continuous, uniform and high-quality metal chalcogenide thin films on a large-area substrate.

A two-dimensional material refers to a material having characteristics in which while atoms in each layer are bonded with each other in a strong ionic or covalent bond, layers are bonded in van der Waals forces so that the layers are easily delaminated from each other. Such a two-dimensional material has characteristics in which charge carriers such as electrons and holes are moved and transferred inside one layer and thus the mobility thereof is very fast. Accordingly, recently, researches on a transition metal chalcogenide thin film such as $MoS_2$, $MoSe_2$, $WS_2$, $WSe_2$, $ReS_2$, or $ReSe_2$, etc., and other two-dimensional materials are being actively performed by many local and abroad research groups.

On the other hand, a method for fabricating a two-dimensional material thin film does not reach a technology for mass production, and thus technologies for mass production of the two-dimensional material thin films are being actively studied. Photo-annealing may be used for improving the characteristics of the two-dimensional material thin films, but the existing arts perform the photo-annealing in an isolated environment in which a chalcogen vapor or a hydrogen chalcogenide gas is supplied into a vacuum chamber or a separate chamber. This process is disadvantageous in that the hydrogen chalcogenide gases are very toxic to the human body and the process is also expensive.

SUMMARY

Some embodiments of the present disclosure provides a method for fabricating continuous, uniform and high-quality metal chalcogenide thin films on large area substrates.

An object of inventive concepts is not limited to the mentioned above, and other objects which have not been mentioned above may be clearly understood by those skilled in the art from the following description.

According to exemplary embodiments of the present inventive concepts, a method for fabricating a metal chalcogenide thin film comprise: forming a metal precursor thin film on a substrate, the metal precursor thin film include a metal thin film and a chalcogen thin film disposed on a lower surface or an upper surface of the metal thin film; and performing a chalcogenization process configured to provide a chalcogen source onto the metal precursor thin film to form a first metal chalcogenide thin film. Here, the metal precursor thin film can be formed in the way of in-situ or ex-situ. Therefore, the ex-situ deposited metal precursor thin film can be partially oxidized due to exposure to air, and the metal precursor film includes pure metal film and partially oxidized metal film due to air-exposure.

In an embodiment, the metal precursor thin film may include a first chalcogen thin film disposed on the lower surface of the metal thin film, and a second chalcogen thin film disposed on the upper surface of the metal thin film.

In an embodiment, by applying the metal precursor thin film composed of the first chalcogen thin film, the metal thin film and the second chalcogen thin film, metal chalcogenide thin films having greatly improved characteristics by a chalcogenization process may be obtained compared with the case where only the metal thin film is used as a precursor.

In an embodiment, the chalcogen thin film may include sulfur (S), selenium (Se), or tellurium (Te), or mixture including one or more thereof.

In an embodiment, the metal thin films may include any one selected from molybdenum (Mo), tungsten (W), strontium (Sr), vanadium (V), manganese (Mn), cobalt (Co), nickel (Ni), copper (Cu), zinc (Zn), palladium (Pd), rhenium (Re), tantalum (Ta), niobium (Nb), hafnium (Hf), gallium (Ga), aluminum (Al), indium (In), tin (Sn), or titanium (Ti), or alloy including one or more thereof. In an embodiment, a thickness of the chalcogen thin film may be thinner than a thickness of the metal thin film.

In an embodiment, the metal thin film may have the thickness range of about 0.2 nm to 10 nm.

In an embodiment, the first metal chalcogenide thin film may have a thickness range of about 0.6 nm to 30 nm.

In an embodiment, the first chalcogenide thin film may have a thickness standard deviation of within about 5%.

In an embodiment, the chalcogenization process may be performed in a temperature range of about 350° C. to 600° C.

In an embodiment, the chalcogenized film may be further annealed in a temperature range of about 500° C. to 700° C.

According to exemplary embodiments of the present inventive concepts, a method for fabricating metal chalcogenide thin films comprise: forming a metal precursor thin film on a substrate, the metal precursor thin film include a metal thin film and a chalcogen thin film disposed on an upper surface or a lower surface of the metal thin film; performing a chalcogenization process configured to provide a chalcogen source onto the metal precursor thin film to form a first metal chalcogenide thin film; and performing a photo-annealing process on the first metal chalcogenide thin film to form a second metal chalcogenide thin film.

In an embodiment, before performing the photo-annealing process, the method may further include forming a transparent encapsulation film on the first metal chalcogenide thin film.

In an embodiment, the transparent encapsulation film may include an insulating material having a band gap energy higher than that of light source in the photo-annealing process.

In an embodiment, an energy density of light used in the photo-annealing process may be greater than about 30 $mJ/cm^2$ and less than about 400 $mJ/cm^2$.

In an embodiment, the photo-annealing process may be performed in the air, and the photo-annealing process may be performed at room temperature without intentional heating and cooling.

In an embodiment, the photo-annealing process may be performed at atmospheric pressure.

The details of other embodiments are included in the detailed description and the drawings.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION

Figure 1:
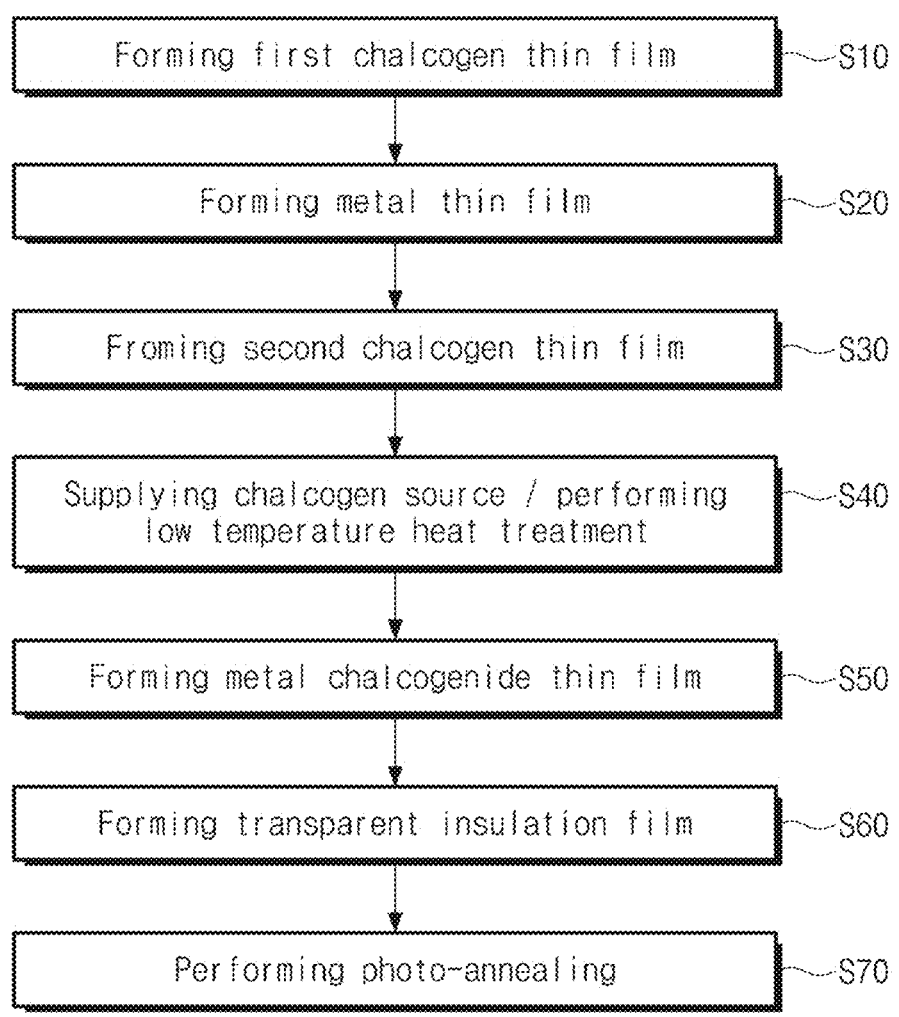
FIG. 1 is a flowchart for describing a method for fabricating a metal chalcogenide thin film according to embodiments of the present inventive concept.

In order to fully understand the configurations and effects of the present invention, preferred embodiments of the present invention will be described with reference to the accompanying drawings. The present invention may, however, be embodied in many different forms and should not be construed as limited to the embodiments set forth herein. It will be apparent to those skilled in the art that the present invention may be embodied in many other specific forms without departing from the spirit or essential characteristics thereof. Those of ordinary skill in the art will appreciate that the concepts of the present invention may be practiced in any suitable environment.

The terminology used herein is for the purpose of illustrating embodiments and is not intended to be limiting of the present invention. In this specification, singular forms include plural forms unless the context clearly dictates otherwise. It will be understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. These terms are merely used to distinguish any given region or film (or layer) from another region or film (or layer). Thus, the membrane referred to as the first membrane in one embodiment may be referred to as the second membrane in another embodiment. Each embodiment described and exemplified herein also includes its complementary embodiment. Like numbers refer to like elements throughout the specification.

In this specification, when a film (or layer) is referred to as being on another film (or layer) or substrate, it may be formed directly on another film (or layer), or a third film (or layer) may be interposed therebetween.

While the terms first, second, third, etc. have been used in various embodiments herein to describe various regions, films (or layers), etc., these regions and films should not be limited by these terms.

The terms used in the embodiments of the present invention may be interpreted as commonly known to those skilled in the art unless otherwise defined.

A method for fabricating a two-dimensional material thin film may be obtained by peeling off a layer by using a tape from a single crystal which is present naturally or synthesized artificially. The thin film formed by using a tape as described above is in a flake shape, very small in size and non-uniform, so that it is difficult to produce an element.

Metal chalcogenide thin films may be fabricated by a chemical reaction between a precursor gas (or vapor) of metal and a chalcogen vapor, or by a chemical reaction between the precursor gas (or vapor) of metal and hydrogen chalcogenide. Alternatively, the metal chalcogenide thin films may be fabricated by previously forming and chalcogenizing a metal thin film.

The two-dimensional metal chalcogenide thin film may be grown directly on a substrate by using a chemical vapor deposition (CVD) method. For example, in a method for depositing $MoS_2$, when the heat-evaporated S-vapor or $H_2S$ gas is supplied and transported onto the substrate while evaporating a $MoO_3$ precursor vapor, an $MoS_2$ thin film may be formed on the substrate via the chemical reaction between Mo-precursor and S-precursor molecules.

The temperature of the CVD process is usually about 800 to 1000° C., and a deposition process is performed in the way that small single crystal nuclei grow into larger crystals on the substrate. However, the CVD method has a difficulty in forming a continuous and uniform film on the substrate. Therefore, when the two-dimensional metal chalcogenide thin film is grown by the CVD method, it is difficult to obtain a continuous film, so that there is being used a process for manufacturing a device by selecting a deposited crystalline region on the substrate where growth has occurred and by transferring the selected region to another substrate on which the device is fabricated.

In addition, the two-dimensional material thin film may be deposited by precursor gasses or precursor vapors as in a plasma enhanced CVD (PECVD) method or an atomic layer deposition (ALD) method. However, when the two-dimensional material thin film is deposited by the PECVD method, the quality of the thin film is deteriorated in the continuous plasma environment, so that it is difficult to be used as an active layer of an electronic device such as transistors and diodes. Therefore, the thin film deposited by PECVD is being mainly used only as a gas sensor or the like at the laboratory level. Also, when the two-dimensional material thin film is deposited by the ALD method or metal organic CVD (MOCVD), the time required for depositing one continuous layer is about 26 hours. Thus, no technology has yet been developed which may be applied to mass production. Accordingly, there is a demand for a method for fabricating metal chalcogenide thin films having an excellent quality enough to be applied to an electronic device such as a field effect transistor and a diode, etc.

Hereinafter, a method for fabricating metal chalcogenide thin films according to embodiments of the inventive concept will be described in detail with reference to the drawings.

FIG. 1 is a flowchart for describing a method for fabricating a metal chalcogenide thin film according to embodiments of the present inventive concept. FIGS. 2A to 2F are cross-sectional views for describing a method for fabricating a metal chalcogenide thin film according to embodiments of the present inventive concept. FIG. 3 illustrates a photograph of a sample of MoS$_2$ thin film FIGS. 4A to 4E are cross-sectional views for describing a method for fabricating a metal chalcogenide thin film according to various embodiments of the present inventive concept.

Figure 2A:
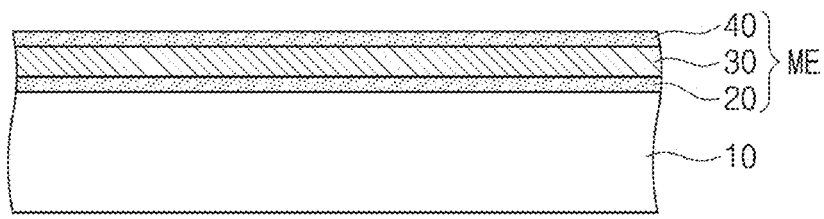
FIGS. 2A to 2F are cross-sectional views for describing a method for fabricating a metal chalcogenide thin film according to embodiments of the present inventive concept.
Figure 3:
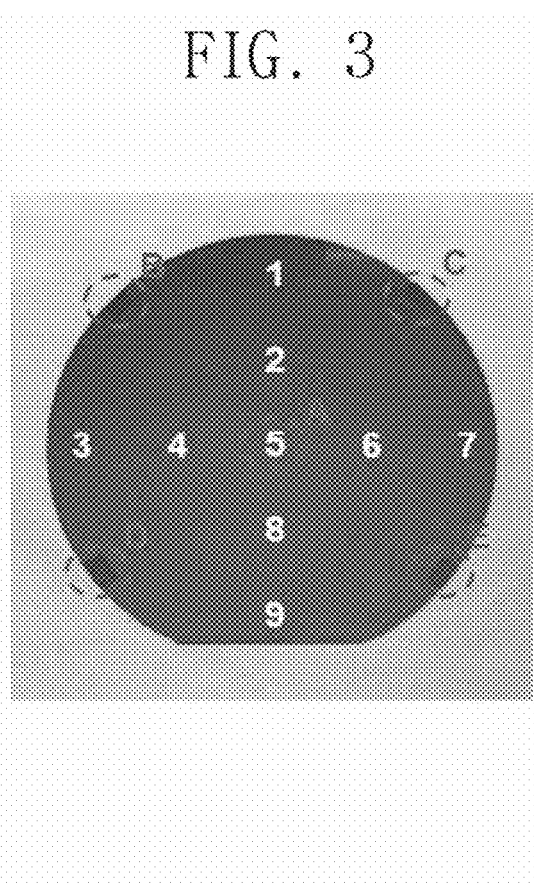
FIG. 3 illustrates a photograph of a sample of $MoS_2$ thin film.

Referring to FIGS. 1 and 2A, a metal precursor thin film ME including a first chalcogen thin film 20, a metal thin film 30, and a second chalcogen thin film 40 which are sequentially stacked may be formed on a substrate 10. The metal film 30 may be partially oxidized in air by being exposed to air if the metal deposition is carried out ex situ. The chalcogen thin films and the metal thin film may be deposited under the condition in which a substrate temperature is room temperature. Also, the chalcogen thin films and the metal thin film may be deposited in a temperature range of about 30 to 100° C. The chalcogen thin films 40 and 20 may be deposited using cracked chalcogen vapor that is cracked from evaporated X$_8$ (X=S, Se, Te) molecules to X$_a$ (a=1~4). The chalcogen vapor may be cracked by using plasma-assisted or thermal cracking.

Specifically, the first chalcogen thin film 20 may be formed on the surface of the substrate 10 (S10).

The substrate 10 may be at least any one of Si, SiO$_2$, BN, Ge, GaN, AlN, GaP, InP, GaAs, SiC, Al$_2$O$_3$, LiAlO$_3$, MgO, glass, quartz, sapphire, graphite, graphene and metal foil. Also, the inventive concept may perform the entire process at a low temperature at which a plastic substrate may withstand, so that at least any one of polyimide (PI), poly ethylene naphthalate (PEN) and poly ethylene terephthalate (PET) may be used. In general, in case of the plastic substrate, a two-dimensional material thin film grown on another substrate at a high temperature is transferred and used, but according to the inventive concept, the thin film may be directly fabricated on the plastic substrate without a transfer process. When a transparent substrate such as glass, quartz, sapphire, or transparent plastic is used in production of the thin film, a transparent electronic device may be manufactured without a transfer process.

The first chalcogen thin film 20 may be deposited on the surface of the substrate 10 by using precursor gasses as in a plasma enhanced CVD (PECVD) method or an atomic layer deposition (ALD) method. The first chalcogen thin film 20 may be a thin film including sulfur (S), selenium (Se), or tellurium (Te).

The first chalcogen thin film 20 may be deposited to be thinner than a thickness of the metal thin film 30 to be subsequently formed. As an example, the first chalcogen thin film 20 may be deposited to a thickness thicker than about 0 nm and thinner than or equal to about 1 nm. The process temperature during deposition may be room temperature. Also, the temperature may also be about 30° C. to 100° C.

Next, the metal thin film 30 may be formed on the first chalcogen thin film 20 (S20). If the metal film 30 and chalcogen films 20 and 40 are in-situ deposited, the metal film may be pure metal. The metal film 30 may be partially oxidized in air by being exposed to air if the metal deposition is carried out ex situ. The partially oxidized metal film may contain metal in elemental state larger than 20%. The photoelectron spectrum of 2.5 nm-thick Mo metal film showed that the film contains 35% of elemental (metallic) Mo state after a few days air-exposure.

Here, the metal thin film 30 may be deposited on the first chalcogen thin film 20 by using an electron beam deposition technology, a sputter deposition technology, or a thermal deposition technology. The metal thin film 30 may be deposited at room temperature. Also, the process may be performed at about 30° C. to 100° C. According to one example, the metal thin film 30 may be deposited to a thickness of about 0.2 nm to 10 nm.

The metal thin film 30 may include, for example, at least any one of Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In Sn, Sb, Ba, La, Hf, Ta, Re, Os, Ir, Pt, Au, Hg, Tl, Pb, or Po.

Subsequently, the second chalcogen thin film 40 may be formed on the metal thin film (S30). The deposition temperature may be room temperature. The second chalcogen thin film 40 may be deposited on the metal thin film 30 by using a physical deposition process. The second chalcogen thin film 40 may be a thin film including, for example, sulfur (S), selenium (Se), or tellurium (Te). The second chalcogen thin film 40 may be deposited to be thinner than the thickness of the metal thin film 30. As an example, the second chalcogen thin film 40 may be deposited to a thickness greater than about 0 nm and less than or equal to about 1 nm. The first chalcogen thin film 20 and the second chalcogen thin film 40 may have the same chalcogen element.

The chalcogen thin films 40 and 20 may be deposited using cracked chalcogen vapor that is cracked from evaporated X$_8$ (X=S, Se, Te) molecules to X$_a$ (a=1~4). The chalcogen vapor may be cracked by using plasma-assisted or thermal cracking methods.

Figure 2B:
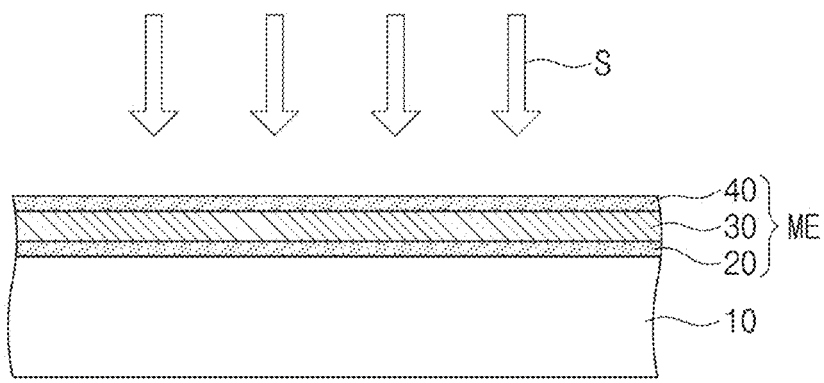

Referring to FIGS. 1 and 2B, a chalcogenization process for a metal precursor thin film ME may be performed by supplying a chalcogen source S to the substrate 10 (S40).

As the chalcogen source, S$_x$, Se$_x$, or Te$_x$ vapor may be supplied to the substrate 10, wherein x is 1, 2, 3, or 4. The chalcogen vapor may be produced by cracking large chalcogen molecules, such as S$_8$, Se$_8$, or Te$_8$, that is evaporated by heating solid chalcogen source. The large chalcogen molecules may be cracked to small chalcogen molecules (x=1~4) by using plasma-assisted or thermal cracking. A hydrogen chalcogenide gas may be used as the chalcogen source. The temperature of the substrate 10 during the chalcogenization process may be maintained in the range of about 350° C. to 600° C. According to embodiments, the first and second chalcogen thin films 20 and 40 may serve as an additional chalcogen source. That is, the first and second chalcogen thin films 20 and 40 may play an important role in a stoichiometric composition of a first metal chalcogenide thin film 50. The first and second chalcogen thin films 20 and 40 may improve the film quality of the first metal chalcogenide thin film 50.

Figure 2C:
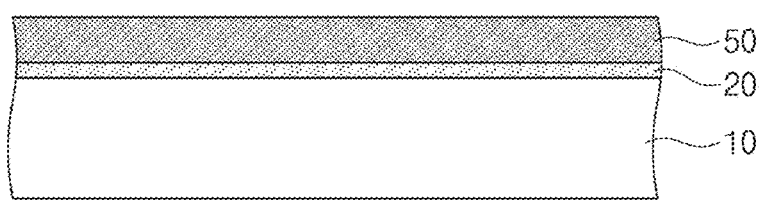

Accordingly, the second chalcogen thin film 40 may react with the metal thin film 30 to form the first metal chalcogenide thin film 50 (S50) as illustrated in FIG. 2C. The first chalcogen thin film 20 may partly react with the metal thin film 30 to form the first metal chalcogenide thin film 50 (S50). Furthermore, the first chalcogen thin film 20 may not be disappeared and remained during the chalcogenide process.

Figure 2D:
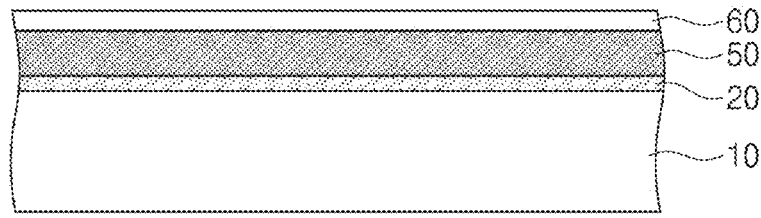

Referring to FIGS. 1 and 2D, a transparent insulation film 60 may be formed on the first metal chalcogenide thin film 50 (S60). The transparent insulatior thin film may be formed by using a method which does not deteriorate an underlying semiconductor layer, such as ALD method, a PEALD method, or a pulsed plasma CVD method.

The transparent insulator thin film 60 may have band gap energy larger than energy of light used in a photo-annealing process to be performed as a subsequent process. That is, the transparent insulator thin film 60 may be composed of an insulator material which does not prevent light from reaching the first metal chalcogenide thin film 50 during the photo-annealing process to be performed subsequently. As an example, the transparent insulator thin film 60 may include $Al_2O_3$, $SiO_2$, $Si_3N_4$, $TiO_2$, $Ta_2O_5$, $ZrO_2$, $HfO_2$, or a combination of two or more thereof. Furthermore, the transparent insulator thin film 60 may prevent the chalcogen atoms further supplied by the first and second chalcogen thin films 20 and 40 or incorporated in the metal chalcogenide film from being evaporated and disappeared. The photo-annealing process may be performed while maintaining the substrate at room temperature without heating the substrate. Also, the photo-annealing process may be performed by exposing the sample in the air at atmospheric pressure.

Meanwhile, according to another embodiment, the forming the transparent insulator thin film 60 may not be provided herein.

Figure 2E:
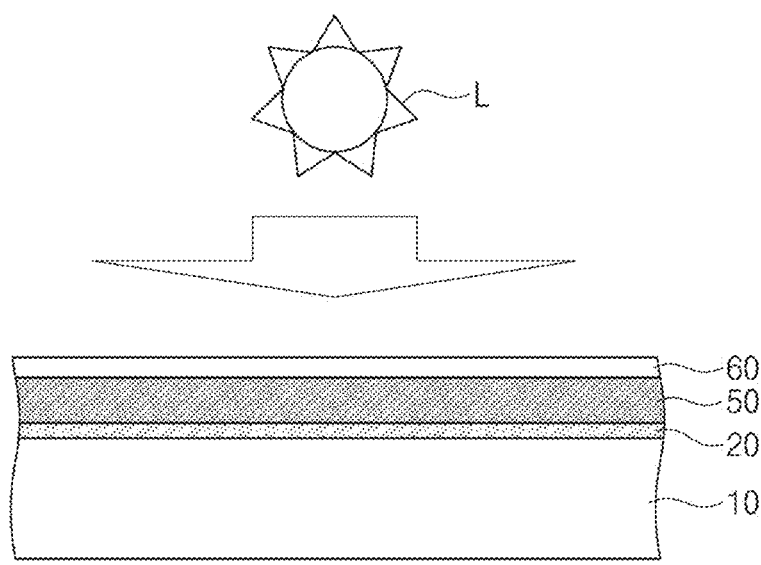
Figure 2F:
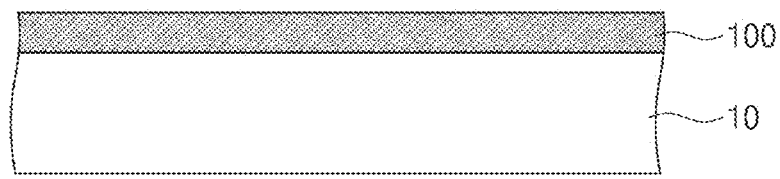

Referring to FIGS. 1 and 2E, a photo-annealing process may be performed on the first metal chalcogenide thin film 50 (S70).

The photo-annealing process may be performed in an atmosphere free of additional chalcogen sources (that is, chalcogen vapor or chalcogen hydride gas). Also, the photo-annealing process may be performed in a non-vacuum state, that is, at atmospheric pressure. Furthermore, the photo-annealing process does not require the use of an inert gas, a chalcogen vapor or a chalcogenide gas, that is, atmospheric pressure in the air, and may be performed at room temperature.

A light source L in the photo-annealing process may have energy greater than band gap energy of the first metal chalcogenide thin film 50. In one example, the wavelength of the light source L may be about 200 nm to 400 nm, and the energy density of light source may be about 30 $mJ/cm^2$ to 300 $mJ/cm^2$. For example, when the energy density of light source are 180 $mJ/cm^2$ and 240 $mJ/cm^2$, the surfaces of the samples were not deformed. The total amount of energy irradiated on the sample by the light source L also affects the quality of films. The total amount of energy irradiated on the sample by the light source L may be smaller than 480 $mJ/cm^2$. When the energy density of light source was 240 $mJ/cm^2$ and the sample was irradiated by two times (that is, 480 $mJ/cm^2$), the surface may be deformed (Referring to following FIG. 5D).

In the photo-annealing process, an ultraviolet laser, an ultraviolet lamp, or the like may be used as the light source L. In the photo-annealing process using the light source L, the first chalcogen thin film 20 under the first metal chalcogenide thin film 50 may fill the chalcogen-deficient sites in the first metal chalcogenide thin film 50, so that the characteristics of a second metal chalcogenide thin film 100 may be superior to the first metal chalcogenide thin film 50. That is, the first metal chalcogenide thin film 50 may receive the chalcogen source from the first chalcogen thin film 20 during the photo-annealing process. Accordingly, the second metal chalcogenide thin film 100 may be formed on the substrate 10. The second metal chalcogenide thin film 100 thus formed may have a thickness of about 0.6 nm to 30 nm. Also, the second metal chalcogenide thin film 100 may have a thickness deviation within about 5%. FIG. 3 illustrates a photograph of a sample of $MoS_2$ thin film prepared on a 3.6-inch wafer, in which the $MoS_2$ thin film having a thickness of 6.1 nm was produced. Referring to FIG. 3, using the AFM height profile, the thickness was measured at 5 points as shown in FIG. 3, and the thickness deviation was within 5%. The thickness standard deviation measured at the positions A-E was smaller than 5%. That is, the second metal chalcogenide thin film 100 having high uniformity may be formed.

Table 1 below shows the characteristics of $MoS_2$ thin films having average thicknesses of about 3 nm and 6 nm, fabricated by using the fabrication method of metal chalcogenide thin films according to embodiments of the inventive concept.

TABLE 1

| Sample description | Surface roughness (maximum peak-to-valley) | Surface roughness (root mean square) |
| --- | --- | --- |
| Sample fabricated without the second chalcogen thin film 20 (thickness of $MoS_2$: 3 nm) | 81.33 nm | 0.69 nm |
| Sample on which the second chalcogen thin film is formed (thickness of $MoS_2$: 3 nm) | 2.5 nm | 0.27 nm |
| Sample fabricated without the second chalcogen thin film 20 (thickness of $MoS_2$: 6 nm) | 89.65 nm | 1.08 nm |
| Sample on which the second chalcogen thin film 20 is formed (thickness of $MoS_2$: 6 nm) | 3.3 nm | 0.40 nm |

Referring to Table 1, the second chalcogen thin film formed on the metal thin film is involved together in the reaction when the chalcogen vapor or the hydrogen chalcogenide vapor reacts with the metal thin film to synthesize the metal chalcogenide thin films. In the embodiment in which the average thickness of the final metal chalcogenide thin film is 3 nm and the second chalcogen thin film does not exist, a fabricated metal chalcogenide thin film has the maximum peak-to-valley value of 81.33 nm, has a root mean square (rms) roughness of 0.69 nm or more, very rough, and contains protrusions over the film. However, when the second chalcogen thin film is formed on the metal thin film, as shown in Table 1, the formation of large and spike-like protrusions is significantly suppressed, and the roughness of the thin film is about 0.2 nm to 0.4 nm, so that a very smooth film may be formed.

Hereinafter, a method for fabricating metal chalcogenide thin films according to various embodiments of the inventive concept will be described with reference to FIGS. 4A to 4E.

Figure 4A:
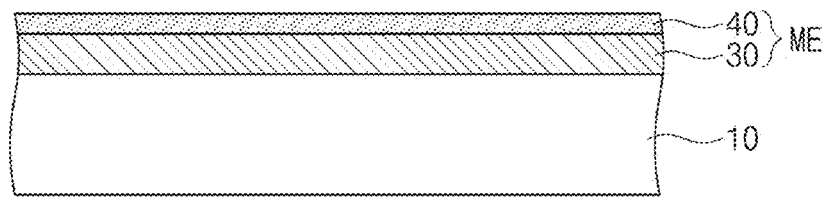
FIGS. 4A to 4E are cross-sectional views for describing a method for fabricating a metal chalcogenide thin film according to various embodiments of the present inventive concept.

Referring to FIG. 4A, the forming the first chalcogen thin film in the embodiment described above will not be provided herein. That is, a metal thin film 30 may be formed directly on the surface of the substrate 10.

Figure 4B:
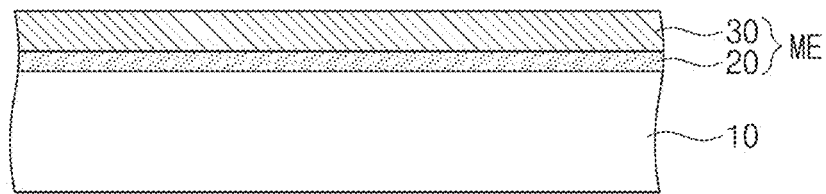

Referring to FIG. 4B, the forming the second chalcogen thin film in the embodiment described above will not be provided herein. That is, after the metal thin film 30 is formed on a first chalcogen thin film 20, a chalcogenide process may be performed by supplying a chalcogen source to the upper surface of the metal thin film 30.

Figure 4C:
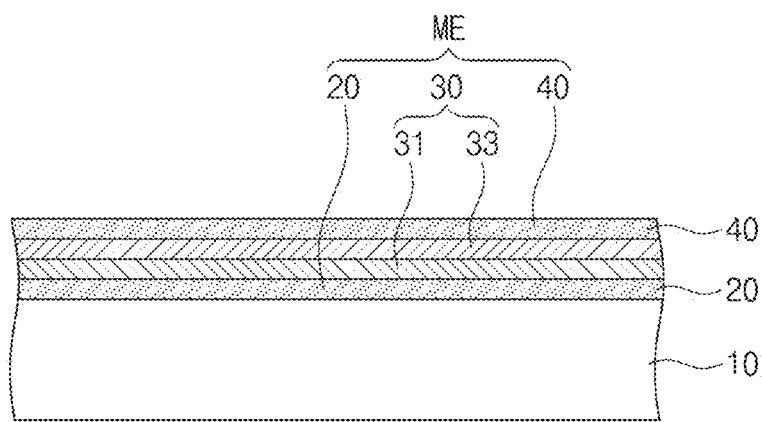

Referring to FIG. 4C, after a substrate 10, a first chalcogen thin film 20, a metal thin film 30 and a second chalcogen thin film 40 are formed in the order named, a chalcogenization process may be performed by supplying a chalcogen source to the sample. Here, the metal thin film 30 may include a first metal thin film 31 and a second metal thin film 33 composed of materials different from each other. Here, the first metal thin film 31 may be a molybdenum (Mo) film, and the second metal thin film 33 may be may be a tungsten (W) film. Alternatively, the first metal thin film 31 may be composed of titanium (Ti), and the second metal thin film 33 may be composed of molybdenum (Mo) or tungsten (W). As another example, the first metal thin film 31 may be composed of indium (In), and the second metal thin film 33 may be composed of molybdenum (Mo) or tungsten (W). Here, the first metal thin film 31 and the second metal thin film 33 can be formed in the way of in-situ or ex-situ. Therefore, the first metal thin film 31 and the second metal thin film 33 may be partially oxidized due to exposure to air, and the first metal thin film 31 and the second metal thin film 33 include pure metal film and partially oxidized metal film due to air-exposure.

Figure 4D:
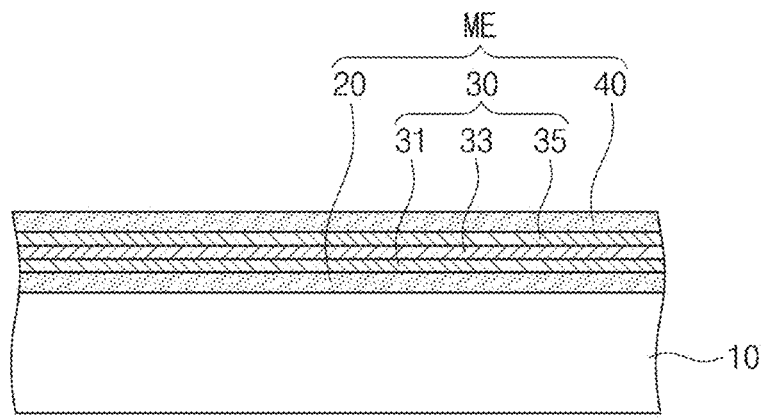

According to the embodiment illustrated in FIG. 4D, after a substrate 10, a first chalcogen thin film 20, a metal thin film 30 and a second chalcogen thin film 40 are formed in the order named, a chalcogenization process may be performed by supplying a chalcogen source to the sample composed of substrate 10 and films 20, 30, 40. Here, the metal thin film 30 may include a first metal thin film 31, a second metal thin film 33, and a third metal thin film 35, which are sequentially stacked on the first chalcogen thin film 20. Here, the metal films may be in-situ or ex-situ deposited. When the metal films are ex-situ deposited, the metal films may be partially oxidized due to the air-exposure. Here, the first metal thin film 31 may be a titanium (Ti) film, the second metal thin film 33 may be a molybdenum (Mo) film, and the third metal thin film 35 may be a tungsten (W) film. Here, the first metal thin film 31 may be a tungsten (W) film, the second metal thin film 33 may be a molybdenum (Mo) film, and the third metal thin film 35 may be a titanium (Ti) film. Alternatively, the first metal thin film 31 may include a metal material equal to the third metal thin film 35, and the second metal thin film 33 may include a metal material different from the first and third metal thin films 31 and 35. The second metal thin film 33 may be a metal film composed of any one of Ti, V, or In. The first metal thin film 31 and the third metal thin film 35 may be a metal film composed of any one of Ti, V, or In. For example, the first to third metal thin films 31, 33 and 35 may be metal films composed of at least one selected from Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In Sn, Sb, Ba, La, Hf, Ta, Re, Os, Ir, Pt, Au, Hg, Tl, Pb or Po.

Figure 4E:
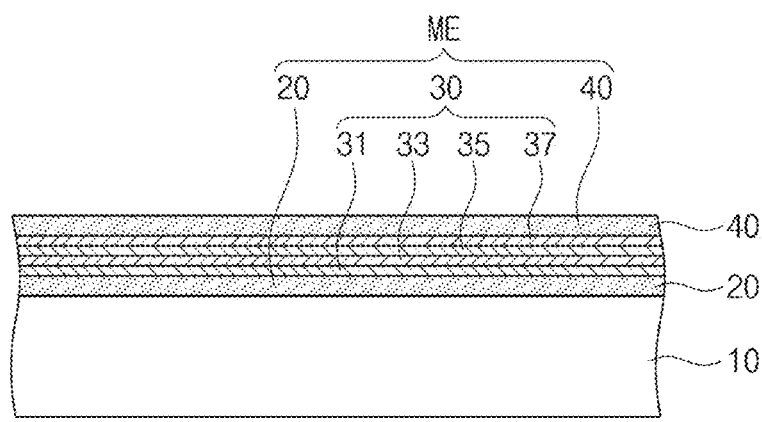

According to the embodiment illustrated in FIG. 4E, a metal thin film 30 may be formed between a first chalcogen thin film 20 and a second chalcogen thin film 40. Here, the metal thin film 30 may include a first metal thin film 31, a second metal thin film 33, a third metal thin film 35, and a fourth metal thin film 37, which are sequentially stacked on the first chalcogen thin film 20. Here, the first and third metal thin films 31 and 35 may include the same first metal material, the second and fourth metal thin films 33 and 37 may include the same second metal material, and the first metal material may be different from the second metal material. As an example, the first and third metal thin films 31 and 35 may be molybdenum (Mo) films, and the second and fourth metal thin films 33 and 37 may be tungsten (W) films.

Alternatively, the first and fourth metal thin films 31 and 37 may include the same first metal material, the second metal thin film 33 may include a second metal material different from the first metal material, and the third metal thin film 35 may include a third metal material different from the first and second metal materials. For example, the first to forth metal materials may be selected from Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In Sn, Sb, Ba, La, Hf, Ta, Re, Os, Ir, Pt, Au, Hg, Tl, Pb, or Po. In one example, the first or fourth metal thin films 31 or 37 may be titanium (Ti) films, the second metal thin film 33 may be a molybdenum (Mo) film, and the third metal thin film 35 may be a tungsten (W) film.

FIGS. 5A to 5D are photographs showing the surfaces of metal chalcogenide thin films depending on light intensity in the photo-annealing process according to embodiments of the inventive concept.

Figure 5A:
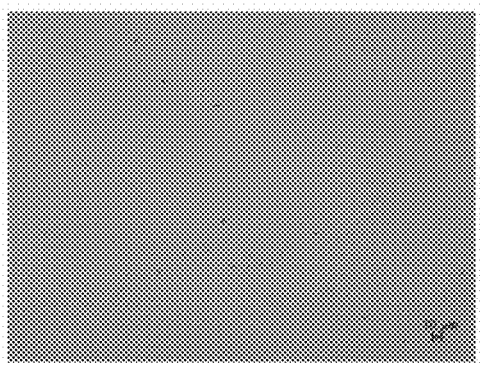
FIGS. 5A to 5D are photographs showing the surfaces of metal chalcogenide thin films depending on light intensity used in a photo-annealing process according to embodiments of the present inventive concept.
Figure 5B:
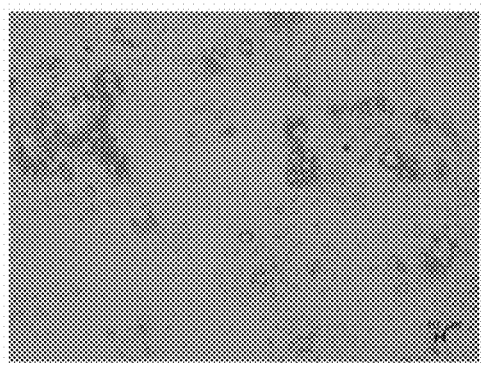
Figure 5C:

FIG. 5A shows the surface of a $MoSe_2$ thin film when the energy density of light irradiated per unit area is 300 $mJ/cm^2$ in the process of fabricating the $MoSe_2$ thin film by using a light source of 308 nm in the photo-annealing process according to embodiments of the inventive concept. Materials analysis data showed that the light irradiation of even 50 $mJ/cm^2$ improved the film quality. FIG. 5B shows a typical shape of the surface of the $MoSe_2$ thin film when the energy density of light irradiated per unit area is 400 $mJ/cm^2$, and FIG. 5C shows a typical shape when the energy density of light is much larger than 400 $mJ/cm^2$. FIG. 5C shows a photograph of a deteriorated film appearing when the energy density of light to be irradiated is much larger than 400 $mJ/cm^2$ and the shape of the film is partially or wholly destroyed.

Furthermore, the energy density of light source may be about 30 $mJ/cm^2$ to 300 $mJ/cm^2$. For example, when the energy density of light source are 180 $mJ/cm^2$ and 240 $mJ/cm^2$, the surfaces of the samples were not deformed. The total amount of energy irradiated on the sample by the light source L also affects the quality of films. The total amount of energy irradiated on the sample by the light source L may be smaller than 480 $mJ/cm^2$. When the energy density of light source was 240 $mJ/cm^2$ and the sample was irradiated by two times (that is, 480 $mJ/cm^2$), the surface was deformed as shown in FIG. 5D.

Figure 5D:
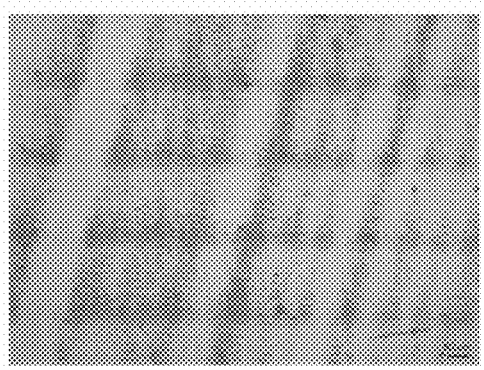

Comparing FIG. 5A with FIGS. 5B to 5D, it may be seen that the surface of the $MoSe_2$ thin film is greatly deformed when the energy density of light is 400 $mJ/cm^2$ or more.

Figure 6:
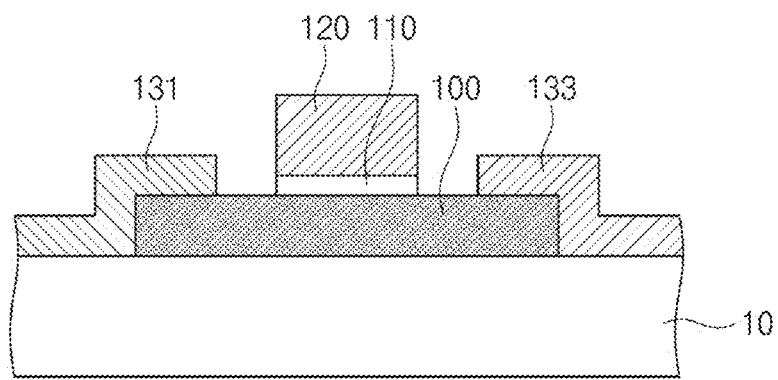
FIG. 6 illustrates a field effect transistor (FET) including a metal chalcogenide thin film formed by a fabrication method according to embodiments of the present inventive concept.

FIG. 6 illustrates a field effect transistor (FET) including a metal chalcogenide thin film formed by the fabrication method according to embodiments of the inventive concept.

Referring to FIG. 6, the field effect transistor may use, as a channel, the second metal chalcogenide thin film 100 fabricated according to the fabrication method of metal chalcogenide thin films described with reference to FIG. 1, and FIGS. 2A to 2F. In one example, the second metal chalcogenide thin film 100 may be a $MoS_2$ thin film having an average thickness of about 3 nm.

Specifically, the second metal chalcogenide thin film 100 may be formed on the substrate 10, and a gate electrode 120 may be disposed on the second metal chalcogenide thin film 100 with a gate insulation film 110 in-between. Source and drain electrodes 131 and 133 may be disposed on the metal chalcogenide thin film 100 at both sides of the gate electrode 120. Although the gate insulator film 110 and the gate electrode 120 are illustrated as being located on the metal chalcogenide thin film 100 in the figure, the embodiment of the inventive concept is not limited thereto. In another example, the gate insulation film 110 and the gate electrode 120 may be located under the metal chalcogenide thin film 100.

Table 2 below shows the characteristics of FET elements using, as a channel, the 6 nm-thick $MoS_2$ thin film fabricated at 500° C. by using the method for fabricating metal chalcogenide thin films according to embodiments of the inventive concept. This result is presented as a best example showing the improvement resulting from multilayer precursor thin films and photo-annealing, although characteristic values thereof may vary depending on the detailed condition of the process such as a chalcogenide temperature. The improvement effect of the photo-annealing is shown to be greater as the film quality is lowered after the chalcogenide process is performed in the range of a process temperature of about 350 to 600° C. According to embodiments, the lower the chalcogenide temperature is, the greater the improvement effect is exhibited to be.

TABLE 2

| Description of sample | Field effect mobility | On/off current ratio |
|---|---|---|
| Sample using the existing single metal precursor thin film of FIG. 1. | Not measurable | Not measurable |
| Simple combination of sample and photo-annealing using the existing single metal precursor thin film of FIG. 1 No photo-annealing processing | Not measurable | Not measurable |
| | Not measurable | 10 |
| Total irradiated light energy 120 mJ/cm$^2$ (Light Energy density: 60 mJ/cm$^2$) | 10 cm$^2$/Vs | 10$^4$ |
| Total irradiated light energy 240 mJ/cm$^2$ (Light Energy density: 120 mJ/cm$^2$) | 42 cm$^2$/Vs | 10$^5$ |

Referring to Table 2, it may be seen that the electric characteristics of the MoS$_2$ field effect transistor are improved as light energy density or the total irradiated energy is increased. However, as shown in the result of FIG. 5B, when the energy density of the light source is 400 mJ/cm$^2$ or higher, the surface of the thin film is deformed. Therefore, in the method for fabricating metal chalcogenide thin films according to embodiments of the inventive concept, the photo-annealing process may be performed at a small energy density of light source greater than about 30 mJ/cm$^2$ and less than about 400 mJ/cm$^2$.

Figure 7A:
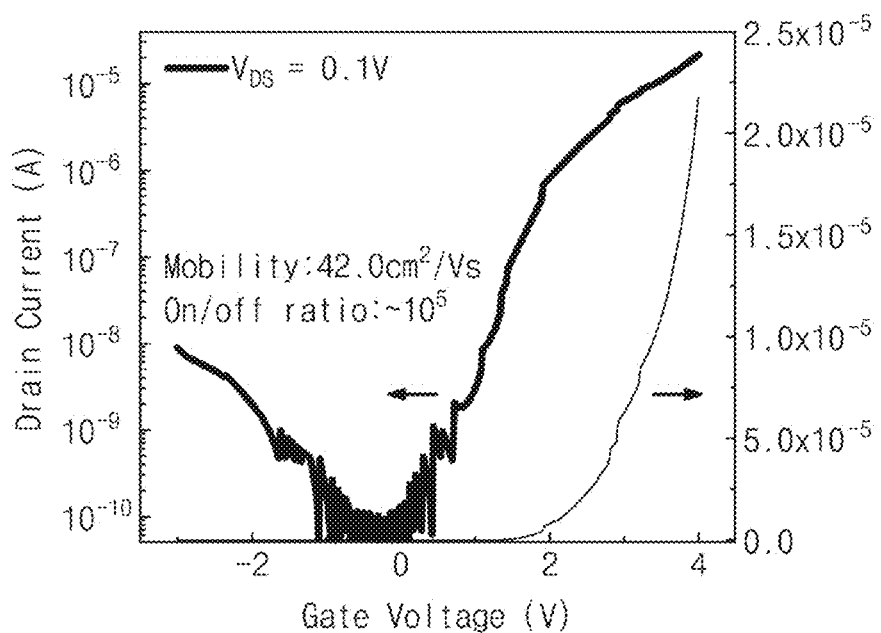
FIGS. 7A and 7B are graphs showing operation characteristics of a field effect transistor (FET) including a metal chalcogenide thin film formed by a fabrication method according to embodiments of the present inventive concept.
Figure 7B:
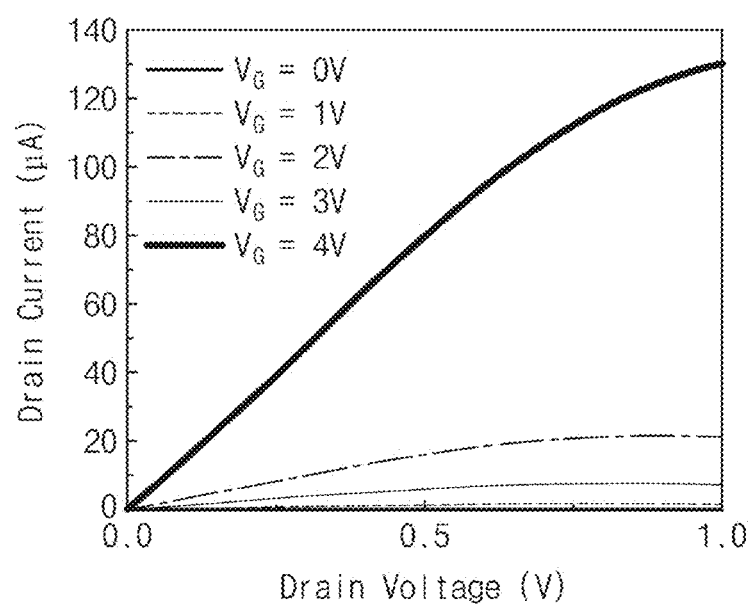

FIGS. 7A and 7B are graphs showing operation characteristics of a MoS$_2$ field effect transistor (FET) including a metal chalcogenide thin film formed by a fabrication method according to embodiments of the inventive concept.

FIG. 7A shows a transfer characteristic of a field effect transistor using a MoS$_2$ thin film having a thickness of about 6 nm as a channel, and FIG. 7B shows a voltage versus current characteristic in a drain electrode.

Referring to FIG. 7A, the field effect transistor using a MoS$_2$ thin film having a thickness of about 6 nm as a channel exhibited a charge mobility of about 42 cm$^2$/Vs.

Referring to FIG. 7B, the drain current was measured while changing the drain voltage in the case of applying a gate voltage V$_G$ of about 0V, 1V, 2V, 3V and 4V. As shown in FIG. 7B, even when the gate voltage and the drain voltage were raised, the drain current was stably measured. That is, it was ascertained that the electric characteristics may be stably obtained from the field effect transistor by using the MoS$_2$ thin film fabricated according to embodiments of the inventive concept.

According to a method for fabricating metal chalcogenide thin films according to embodiments of the inventive concept, by forming chalcogen thin film above and/or below the metal thin film and performing a chalcogenide process, the chalcogen thin film additionally serve as a chalcogen source during a chalcogen vapor or a hydrogen chalcogenide vapor react with the metal thin films, and thus metal grains are blocked from being grown to form large protrusions, so that metal chalcogenide thin films having very small surface roughness and excellent quality may be fabricated. Also, the photo-annealing process may be performed in non-vacuum, that is, in the air at room temperature. Therefore, according to embodiments of the inventive concept, the metal chalcogenide thin films may be fabricated to a thickness of about 0.6 to 30 nm at a low temperature on a large diameter substrate. Further, the present fabrication method may be carried out on a large diameter wafer of 6 inches or more or on a large area substrate of which one side has a length of 10 cm or more.

As described above, although the embodiments of the inventive concept have been described with reference to the accompanying drawings. It will be understood by those skilled in the art that various changes in form and details may be made therein without departing from the spirit and scope of the invention as defined by the appended claims. It is therefore to be understood that the above-described embodiments are illustrative in all aspects and not restrictive.

What is claimed is:

1. A method for fabricating a metal chalcogenide thin film, the method comprising:
    forming a metal precursor thin film on a substrate, the metal precursor thin film including a metal thin film and a first chalcogen thin film disposed on a lower surface of the metal thin film, and a second chalcogen thin film disposed on an upper surface of the metal thin film;
    performing a chalcogenization process configured to provide a chalcogen source onto the metal precursor thin film to form a first metal chalcogenide thin film formed by reaction of the metal thin film and the second chalcogen thin film; and
    performing a photo-annealing process on the first metal chalcogenide thin film to form a second metal chalcogenide thin film formed by reaction of the first metal chalcogenide thin film and the first chalcogen thin film, wherein the photo-annealing process is performed in air.

2. The method of claim 1, wherein the metal precursor thin film is formed in the way of an in-situ process or an ex-situ process, and
    the metal precursor thin film formed in the way of ex-situ is partially oxidized due to exposure to air.

3. The method of claim 2, the metal precursor film includes pure metal film and partially oxidized metal film due to air-exposure.

4. The method of claim 3, wherein the partially oxidized metal film of the metal precursor thin film formed in the way of ex-situ contains metal in an elemental state larger than 20%.

5. The method of claim 1, wherein at least one of the first or second chalcogen thin films comprises sulfur (S), selenium (Se), tellurium (Te), or mixture including one or more thereof.

6. The method of claim 1, wherein at least one of the first or second chalcogen thin films is deposited using chalcogen vapor composed of one to four chalcogen atoms.

7. The method of claim 1, wherein the metal thin film comprises any one selected from molybdenum (Mo), tungsten (W), strontium (Sr), vanadium (V), manganese (Mn), cobalt (Co), nickel (Ni), copper (Cu), zinc (Zn), palladium (Pd), rhenium (Re), tantalum (Ta), niobium (Nb), hafnium (Hf), gallium (Ga), aluminum (Al), indium (In), tin (Sn), or titanium (Ti), or alloy including one or more thereof.

8. The method of claim 1, wherein a thickness of at least one of the first or second chalcogen thin films is thinner than a thickness of the metal thin film.

9. The method of claim 8, wherein the metal thin film has a thickness range of about 0.2 nm to 10 nm.

10. The method of claim 1, wherein the first metal chalcogenide thin film has a thickness range of about 0.6 nm to 30 nm.

11. The method of claim 1, wherein the chalcogenization process is performed in a temperature range of about 350° C. to 600° C.

12. The method of claim 1, wherein the chalcogenization process uses chalcogen vapor composed of one to four chalcogen atoms.

13. The method of claim 1, wherein the photo-annealing process on the first metal chalcogenide thin film is performed in a temperature range of about 500° C. to 700° C.

14. The method of claim 1, wherein the first metal chalcogenide thin film and the second metal chalcogenide thin film comprise a sulfur (S) element, a selenium (Se) element, or a tellurium (Te) element which is not a compound.

15. A method for fabricating metal chalcogenide thin films, the method comprising:
forming a metal precursor thin film on a substrate, the metal precursor thin film including a metal thin film and a chalcogen thin film disposed on an upper surface or a lower surface of the metal thin film;
performing a chalcogenization process configured to provide a chalcogen source onto the metal precursor thin film to form a first metal chalcogenide thin film; and
performing a photo-annealing process on the first metal chalcogenide thin film to form a second metal chalcogenide thin film;
wherein the photo-annealing process is performed in air.

16. The method of claim 15, before performing the photo-annealing process, further comprising forming a transparent encapsulation film on the first metal chalcogenide thin film.

17. The method of claim 16, wherein the transparent encapsulation film comprises an insulating material having a band gap energy higher than that of a light source in the photo-annealing process.

18. The method of claim 15, wherein an energy density of light used in the photo-annealing process is greater than about 30 mJ/cm$^2$ and less than about 400 mJ/cm$^2$.

19. The method of claim 15, wherein the photo-annealing process is performed at room temperature without intentional heating and cooling.

20. The method of claim 15, wherein the photo-annealing process is performed at atmospheric pressure.

21. A method for fabricating metal chalcogenide thin films, the method comprising:
forming a metal precursor thin film on a substrate, the metal precursor thin film including a metal thin film and a chalcogen thin film disposed on an upper surface or a lower surface of the metal thin film;
performing a chalcogenization process configured to provide a chalcogen source onto the metal precursor thin film to form a first metal chalcogenide thin film;
forming a transparent encapsulation film on the first metal chalcogenide thin film; and
performing a photo-annealing process on the first metal chalcogenide thin film to form a second metal chalcogenide thin film.

* * * * *